(12) United States Patent
Kuenemund

(10) Patent No.: US 9,729,133 B2
(45) Date of Patent: Aug. 8, 2017

(54) ELECTRONIC TRANSMISSION ELEMENT

(71) Applicant: Infineon Technologies AG, Neubiberg (DE)

(72) Inventor: Thomas Kuenemund, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 436 days.

(21) Appl. No.: 14/321,843

(22) Filed: Jul. 2, 2014

(65) Prior Publication Data
US 2015/0008763 A1 Jan. 8, 2015

(30) Foreign Application Priority Data
Jul. 3, 2013 (DE) .................... 10 2013 106 976

(51) Int. Cl.
*H03K 17/00* (2006.01)
*H03K 3/84* (2006.01)

(52) U.S. Cl.
CPC ............. *H03K 17/002* (2013.01); *H03K 3/84* (2013.01); *Y10T 307/76* (2015.04)

(58) Field of Classification Search
CPC .................................................... H03K 17/00
See application file for complete search history.

(56) References Cited

U.S. PATENT DOCUMENTS

| 6,229,357 B1 * | 5/2001 | Nair ....................... H03K 3/037 327/115 |
| 6,965,263 B2 * | 11/2005 | Sringivijayaraghavan H03K 17/063 327/536 |
| 2006/0033526 A1 | 2/2006 | Yamamoto |

* cited by examiner

*Primary Examiner* — Hai L Nguyen
(74) *Attorney, Agent, or Firm* — Viering, Jentschura & Partner mbB

(57) ABSTRACT

According to an embodiment, an electronic transmission element is provided that has a first input and a first output. The first input is coupled to the first output by means of two first, parallel-connected complementary switches. The first switches each have a control input. The electronic transmission element further has a second input and a second output. The second input is coupled to the second output by means of two second, parallel-connected complementary switches. The second switches each have a control input. The first output is coupled to the control inputs of the second switches and the second output is coupled to the control inputs of the first switches.

20 Claims, 17 Drawing Sheets

ELECTRONIC TRANSMISSION ELEMENT

CROSS-REFERENCE TO RELATED APPLICATION

This application claims priority to German Patent Application Serial No. 10 2013 106 976.2, which was filed Jul. 3, 2013, and is incorporated herein by reference in its entirety.

TECHNICAL FIELD

Various embodiments relate generally to electronic transmission elements.

BACKGROUND

For various instances of application, such as for monitoring operating parameters for integrated circuits, such as temperature and supply voltage, for monitoring process fluctuations, for generating random numbers or providing PUFs (physical unclonable functions), circuits are desirable that are sensitive toward operating parameters, process fluctuations or noise, etc.

SUMMARY

According to an embodiment, an electronic transmission element is provided that has a first input and a first output. The first input is coupled to the first output by means of two first, parallel-connected complementary switches. The first switches each have a control input. The electronic transmission element further has a second input and a second output. The second input is coupled to the second output by means of two second, parallel-connected complementary switches. The second switches each have a control input. The first output is coupled to the control inputs of the second switches and the second output is coupled to the control inputs of the first switches.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The detailed description that follows relates to the accompanying figures, which show details and embodiments. These embodiments are described in such detail that a person skilled in the art is able to implement the invention. Other embodiments are also possible and the embodiments can be changed in structural, logical and electrical respects without departing from the subject matter of the invention. The various embodiments are not necessarily mutually exclusive but rather different embodiments can be combined with one another, so that new embodiments are produced.

Figure 1:
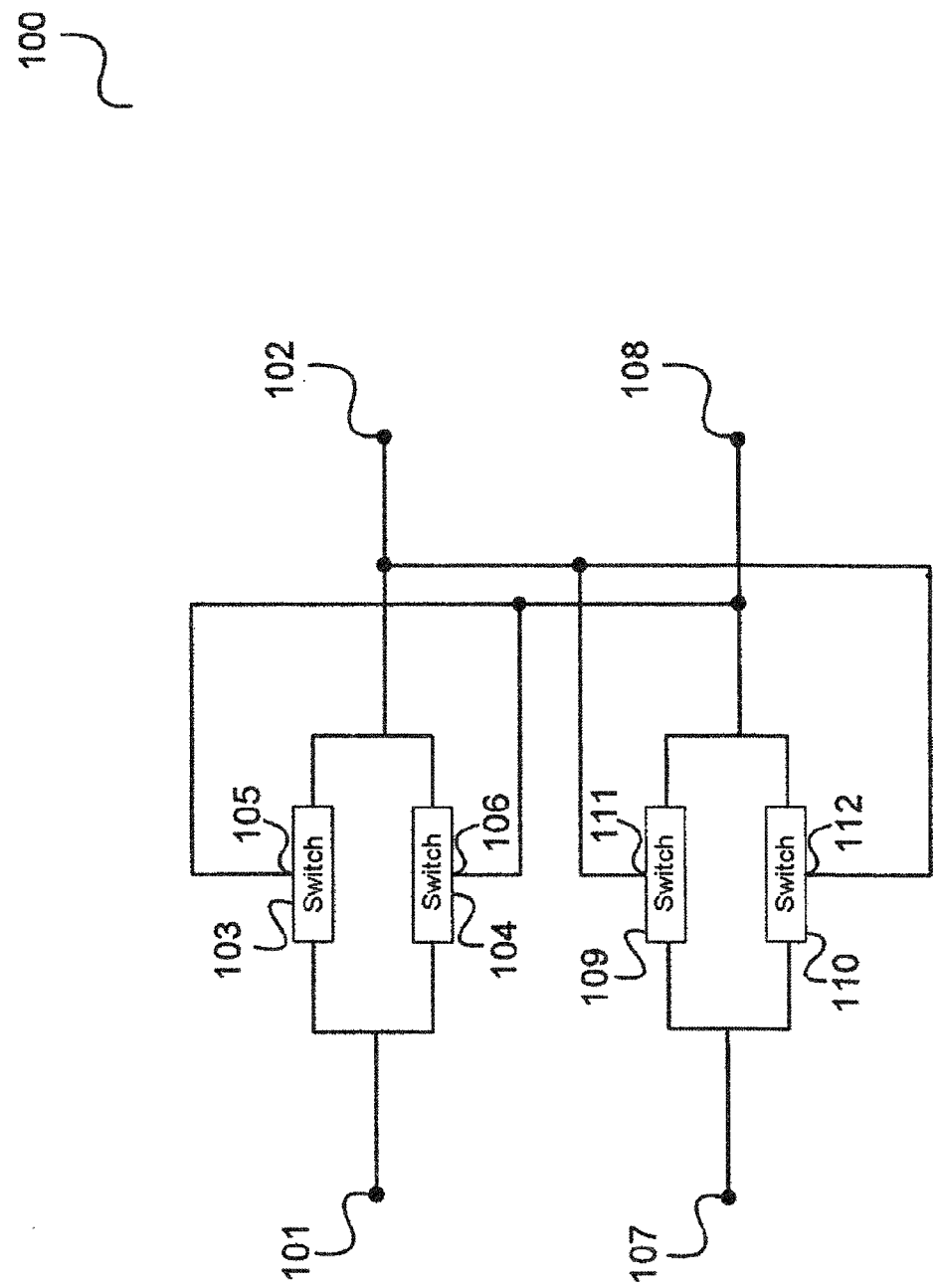
FIG. 1 shows an electronic transmission element according to an embodiment.

FIG. 1 shows an electronic transmission element 100.

The electronic transmission element has a first input 101 and a first output 102, wherein the first input 101 is coupled to the first output 102 by means of two first, parallel-connected complementary switches 103, 104 and wherein the first switches 103, 104 each have a control input 105, 106.

The electronic transmission element also has a second input 107 and a second output 108, wherein the second input 107 is coupled to the second output 108 by means of two second, parallel-connected complementary switches 109, 110 and wherein the second switches 109, 110 each have a control input 111, 112.

The first output 102 is coupled to the control inputs 111, 112 of the second switches 109, 110 and the second output 108 is coupled to the control inputs 105, 106 of the first switches 103, 104.

In other words, an electronic circuit having two paths that each connect an input to an output is provided, wherein each path contains two parallel-connected switches that are complementary, i.e. are closed at opposite levels, the switches being controlled by the output level of the respective other path.

According to an embodiment, the first switches and the second switches are transistors. In other words, the two first switches are mutually complementary transistors and the second switches are mutually complementary transistors.

By way of example, the first switches are an n-channel field-effect transistor and a p-channel field-effect transistor and the second switches are an n-channel field-effect transistor and a p-channel field-effect transistor, wherein the control inputs of the switches are the gate connections of the field-effect transistors.

In another embodiment, the first switches are an npn bipolar transistor and a pnp bipolar transistor and the second switches are an npn bipolar transistor and a pnp bipolar transistor, wherein the control inputs of the switches are the base connections of the bipolar transistors.

By way of example, the first switches are designed such that they switch at different times. By way of example, the first switches switch in succession (and not at the same time) for a change in the logic level of the second output node (e.g. from 0 to 1 or vice versa).

By way of example, the first switches are designed such that they switch at different levels of the second output node (e.g. at different levels between VDD and VSS).

By way of example, the second switches are designed such that they switch at different times. By way of example, the second switches switch in succession (and not at the same time) for a change in the logic level of the first output node (e.g. from 0 to 1 or vice versa).

By way of example, the second switches are designed such that they switch at different levels of the first output node (e.g. at different levels between VDD and VSS).

By way of example, the first switches and the second switches are set up to each switch between a first state and a second state, wherein a switch conducts current better in the first state (e.g. a closed state) than in the second state (e.g. an open state or a state of transition to the open state).

By way of example, the first switches and the second switches are field-effect transistors, and they are in strong inversion in the first state and they are in weak inversion, or in the off state, in the second state.

According to an embodiment, at least one of the first switches is of a different design than the second switches (for example in respect of electrical properties such as threshold voltage, etc.). In other words, the transmission element may be of asymmetric design in respect of the first switches and the second switches (i.e. in respect of the two transmission paths).

By way of example, at least one of the first switches has different dimensions than the second switches.

According to an embodiment, a circuit arrangement has an electronic transmission element as described above, and has an input stage that is set up to supply the first input of the transmission element with a first logic level and to supply the second input of the transmission element with a second logic level, which is the complement of the first logic level.

By way of example, the circuit arrangement is set up to take the delay with which the transmission element outputs the supplied logic levels by means of the outputs as a basis for ascertaining at least one from a PUF value, a random number, an operating parameter and a production parameter for the circuit arrangement.

According to an embodiment, the circuit arrangement has a ring oscillator that has the transmission element, wherein the circuit arrangement is set up to take the frequency of the ring oscillator as a basis for ascertaining at least one from a PUF value, a random number, an operating parameter and a production parameter for the circuit arrangement. By way of example, the ring oscillator has a plurality of series-connected transmission elements as described above.

By way of example, the operating parameter is an operating parameter for the circuit arrangement or a supply voltage for the circuit arrangement.

An example of an electronic transmission element according to FIG. 1 is described below with reference to FIG. 2.

Figure 2:
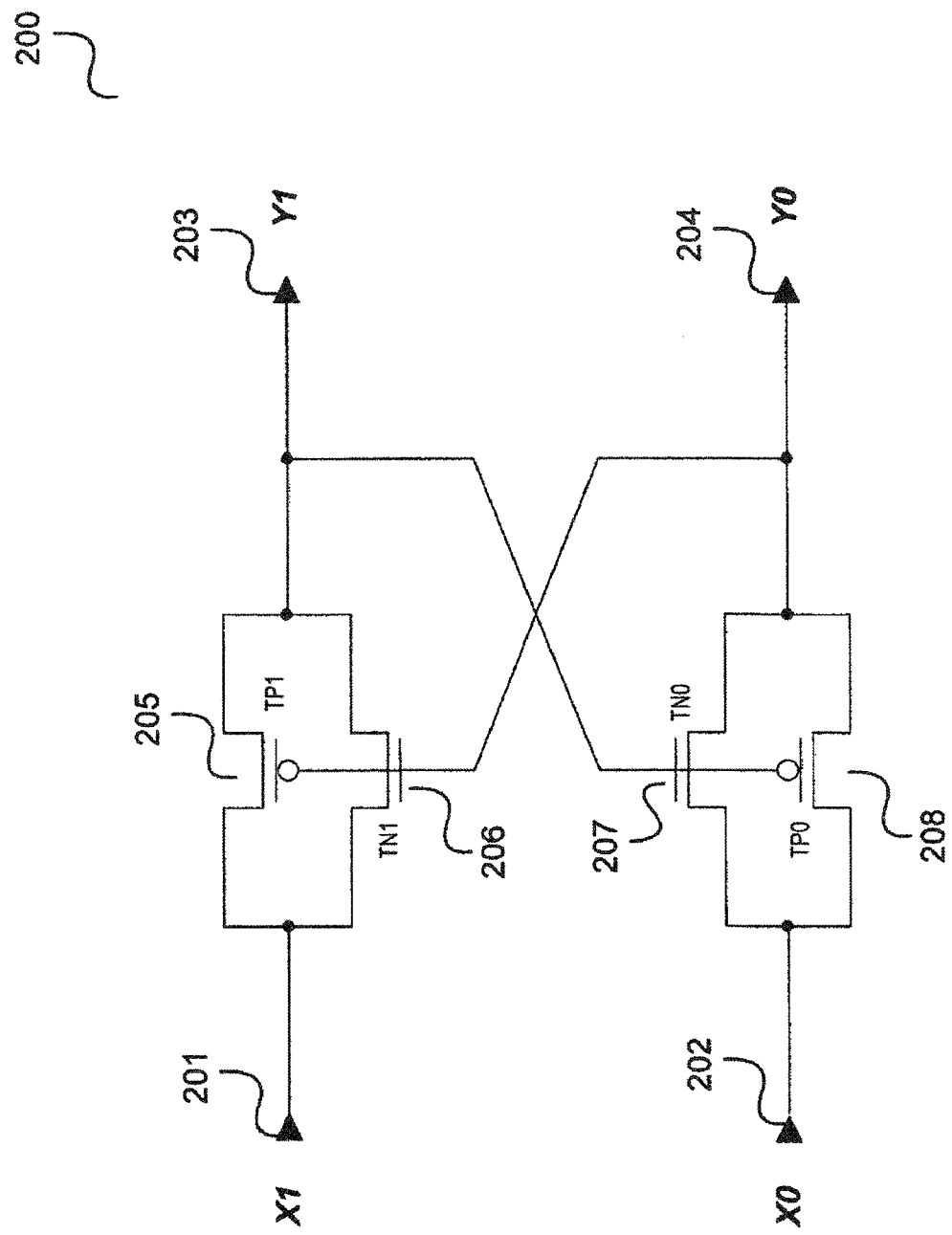
FIG. 2 shows a transmission gate according to an embodiment.

FIG. 2 shows a transmission gate 200, also called a differential feedback transfer gate (DFTG).

The transmission gate 200 has a first input node 201 denoted by X1, a second input node 202 denoted by X0, a first output node 203 denoted by Y1 and a second output node 204 denoted by Y0.

A first p-channel field-effect transistor 205 (called TP1) is connected between the first input node 201 and the first output node 203. Connected in parallel therewith is a first n-channel field-effect transistor 206 (called TN1) between the first input node 201 and the first output node 203.

A second n-channel field-effect transistor 207 (called TN0) is connected between the second input node 202 and the second output node 204. Connected in parallel therewith is a second p-channel field-effect transistor 208 (called TP0) between the second input node 202 and the second output node 204.

The first output node 203 is fed back to the gates of the second n-channel field-effect transistor 207 and the second p-channel field-effect transistor 208.

The second output node 204 is fed back to the gates of the first p-channel field-effect transistor 205 and the first n-channel field-effect transistor 206.

It is subsequently assumed that the logic value 0 corresponds to the lower supply potential VSS and that the logic value 1 corresponds to the upper supply potential VDD.

Furthermore, it is assumed that the node pairs (X1, X0) and (Y1, Y0) are each able to assume the two complementary equilibrium states (1,0) and (0,1), and that switching takes place to and fro between these two states (by virtue of respective suitable actuation from the outside via (X1, X0) (and (Y1, Y0)), with (X1, X0) forming the input node pair and (Y1, Y0) forming the output node pair in the case of the mode of operation described below.

As can be seen from FIG. 2, the transmission gate 200 is of symmetric design in respect of the transposition of the nodes X1 and X0 (and of Y1 and Y0), which means that, without restricting the generality, it is sufficient to consider the transition of (X1, X0) from (1,0) to (0,1) and the resultant time response of (Y1, Y0) for the transition from (1,0) to (0,1).

Figure 3:
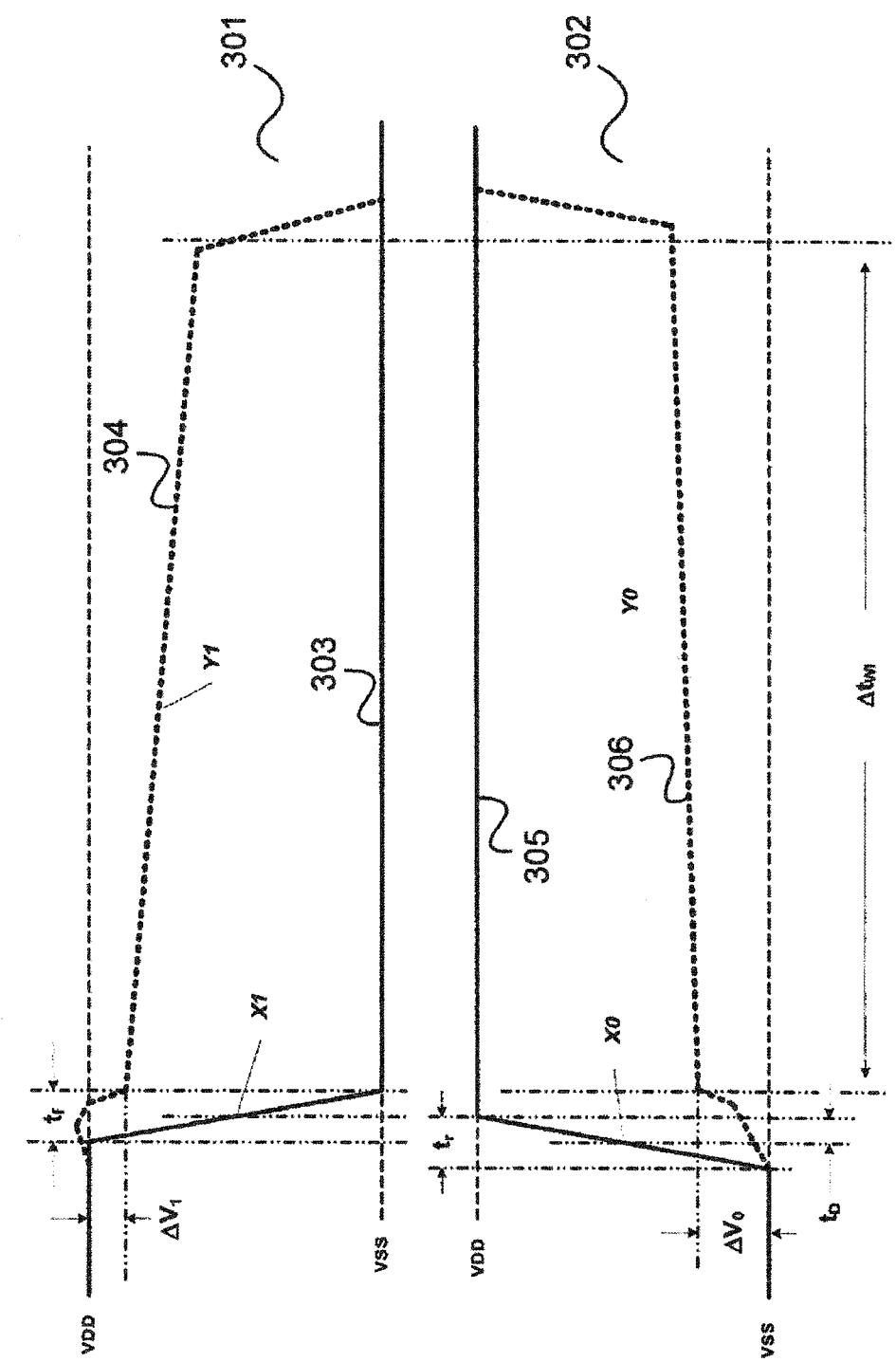
FIG. 3 shows the time response for changeover of the input node pair from (1,0) to (0,1) for the transmission gate from FIG. 2.

FIG. 3 shows the time response for changeover of the input node pair (X1, X0) from (1,0) to (0,1).

In this case, a first graph 301 shows the level profile of X1 in a first curve and the level profile of Y1 in a second (dashed) curve 304.

A second diagram 302 shows the level profile of X0 in a third curve 305 and the level profile of Y0 in a fourth (dashed) curve 306.

The time increases from left to right in each of the graphs 301, 302, and the level (i.e. the respective node potential)

increases from bottom to top in each case, moving between VSS and VDD according to the assumed logic levels.

As FIG. 3 shows, the transition of (Y1, Y0) from (1,0) to (0,1) does not take place in the manner of that of (X1, X0), that is to say does not take place with switching times $t_r$ and $t_f$, which are in the order of magnitude of 100 ps for standard CMOS in deep submicron technologies, for example. The input signals for the input nodes 201, 202 are provided by means of standard CMOS gates, for example.

After a short initial phase, during which the first p-channel transistor 205 and the second n-channel transistor 207 are still in strong inversion (SI), and after which the potential of Y1 has fallen by $\Delta V_1$ and that of Y0 has risen by $\Delta V_0$, all four transistors 205, 206, 207, 208 are in weak inversion (WI) and therefore operate below their respective threshold voltage (the threshold voltages are called Vth(P1), Vth(N1), Vth(P0), Vth(N0) in accordance with the designations of the transistors).

The accompanying comparatively small channel currents in turn result in the electrical (load) capacitances $C_Y$ (for example having the respective gate capacitances of the transistors and capacitances of nodes connected to the transition gate 200 on the output side) connected to Y1 and Y0 being able to undergo charge reversal only very slowly, which means that a much longer time interval $\Delta t_{WI}$ elapses in comparison with standard CMOS switching times before the potentials at Y1 and Y0 have reached values that allow the transition from weak inversion to strong inversion for the first n-channel transistor 206 and the second p-channel transistor 208: Y0 has then risen to approximately Vth(N1) and Y1 has then fallen to approximately VDD−|Vth(P0)|.

The result is thus that the reciprocal negative feedback from Y1 to the gate connections of the second p-channel transistor 208 and the second n-channel transistor 207 and/or from Y0 to the gate connections of the first p-channel transistor 205 and the first n-channel transistor 206 (there also being capacitive coupling between Y1 and Y0 via the gate capacitances of the transistors 205, 206, 207, 208, which is indicated in FIG. 2 by the overshoot in Y1 during $t_f$) initially results in mutual obstruction of the charge transport, but that the same negative feedback also means mutual support for the non-equilibrium state that lasts $\Delta t_{WI}$ (that is to say the phase of weak inversion, during which none of the transistors 205, 206, 207, 208 is in strong inversion) moving in the direction of the new equilibrium state (in which (Y1, Y0) assumes the state (0,1)) until one of the threshold voltages of the first n-channel transistor 206 or the second p-channel transistor 208 has been reached, whereupon the respective other threshold voltage is then also very quickly exceeded and immediately thereafter (Y1, Y0) adjusts itself to (0,1).

The DFTG switching processes from (1,0) to (0,1) and from (0,1) to (1,0) are thus practically exclusively dependent on the weak-inversion response of the transistors 205, 206, 207, 208 (wherein the attainment of $\Delta V_1$ or $\Delta V_0$ is followed by the first p-channel transistor 205 and the second n-channel transistor 207 now contributing only little to the charge reversal of the output nodes 203, 204 owing to very rapidly, on account of their source diodes and drain bulk diodes that are then reverse-biased).

It is subsequently assumed that the transistors 205, 206, 207, 208 are MOSFETs (metal oxide semiconductor field-effect transistors).

For the channel current, e.g. of an nMOS transistor (i.e. n-channel MOSFET) in a weak inversion range, the following applies:

$$I_{DS} = 2\mu \cdot C_{ox} \frac{W}{L}\left(\frac{kT}{e}\right)^2 e^{e \cdot \frac{V_{GS}-V_{th}}{kT}} \left\{ e^{e \cdot \frac{-V_{SB}}{kT}} - e^{e \cdot \frac{-V_{DB}}{kT}} \right\},$$

with the mobility μ, the specific gate capacitance $C_{ox}$, the width W and the length L of the gate, the Boltzmann constant k, the temperature T, the elementary charge e, the threshold voltage $V_{th}$ and the voltages $V_{GS}$, $V_{SB}$ and $V_{DB}$ between gate and source, source and bulk (substrate) and drain and bulk, respectively.

There are thus prevailing exponential dependences of the channel current on T and $V_{th}$ and also on the terminal voltages $V_{GS}$, $V_{SB}$ and $V_{DB}$, quite in contrast to the linear or quadratic dependences in the range of strong inversion.

The channel currents in the range of weak inversion are thus proportional to factors in the form $$e^{-\frac{\Delta E}{kT}} \text{ with } \Delta E = e \cdot (V_{th} - V_{GS})$$

(hence for quantum statistical residence probability for mobile charge carriers (electrons and holes) in the conduction or valence band).

At the start of the range of weak inversion, $$V\frac{0}{GS} = \Delta V_0$$

applies (for the first n-channel transistor 206) and $$V\frac{0}{GS} = -\Delta V_1$$

applies (for the second p-channel transistor 208).

With load capacitances $C_Y$ at Y1 and Y0 and from $$dt = C \cdot \frac{dV}{I(V)},$$

the following then applies:

$$\Delta t_{WI} = C_Y \cdot \int_{V_{GS}^0}^{V_{th}} \frac{dV_{GS}}{I(V_{GS})} \sim C_Y \cdot e^{\frac{e}{kT}(V_{th}-V_{GS}^0)}.$$

Since $$V\frac{0}{GS}$$

and $\Delta V_1$, $\Delta V_0$ rise at greater VDD, there are thus exponential relationships between $\Delta t_{WI}$ and both T and VDD: both rising temperature and rising supply voltage VDD result in an exponential drop in $\Delta t_{WI}$ (see also FIG. 7 described below, which shows the exponential growth of DFTG ring oscillator frequencies that are proportional, in a good approximation, to $1/\Delta t_{WI}$). In respect of temperature dependence, this is enhanced further by the threshold voltage $V_{th}$, which decreases as temperature T rises.

The DFTG switching response ($\Delta V_1$, $\Delta V_0$ and particularly the switching time, which is determined substantially by $\Delta t_{WT}$) is thus significantly different than that of standard CMOS gates. In particular, this relates to:

(A) the dependences of the switching period on temperature, supply voltage and production process fluctuations.

(B) The resultant substantially increased DFTG sensitivity toward (thermal) noise.

(C) The increased sensitivity—which likewise results from (A)—of pairs of DFTG circuits toward production fluctuations (particularly the local variations in channel implantations and hence the threshold voltages $V_{th}$ of the transistors).

According to an embodiment, the values of $\Delta V_1$, $\Delta V_0$ and $\Delta t_{WT}$ are set by virtue of suitable selection of the following parameters for the respective desired instance of application:

W, L and $V_{th}$ (e.g. a high threshold voltage (high Vth) or a normal threshold voltage (standard Vth) for the transistors 205, 206, 207, 208 involved, depending on the instance of application;

selection of the substrate connections of the transistors 205, 206, 207, 208 (e.g. connection of the substrate connections of the p-channel transistors 205, 208 to VDD or Y1, Y0 etc. or connection of the substrate connections of the n-channel transistors 206, 207 to VSS or Y1, Y0);

selection of the rise and fall times $t_r$ and/or the delay $t_D$ for the input signals X1 and X0.

These parameters can be set individually for the transistors 205, 206, 207, 208. In various embodiments, the transition gate 200 can be designed asymmetrically for particular instances of application.

Various instances of application are described below.

First of all, the use of a transmission gate as described in FIG. 2 is described for a circuit arrangement for sensing and monitoring the operating conditions (such as production parameters, supply voltage (VDD) and temperature (T)) of integrated circuits. By way of example, such a circuit arrangement can be used instead of a sensor in analog circuitry for VDD monitoring or temperature monitoring or a standard circuit (e.g. in static CMOS circuitry) for a process monitoring module (PCM module, for Process Control Monitor Module).

Figure 4:
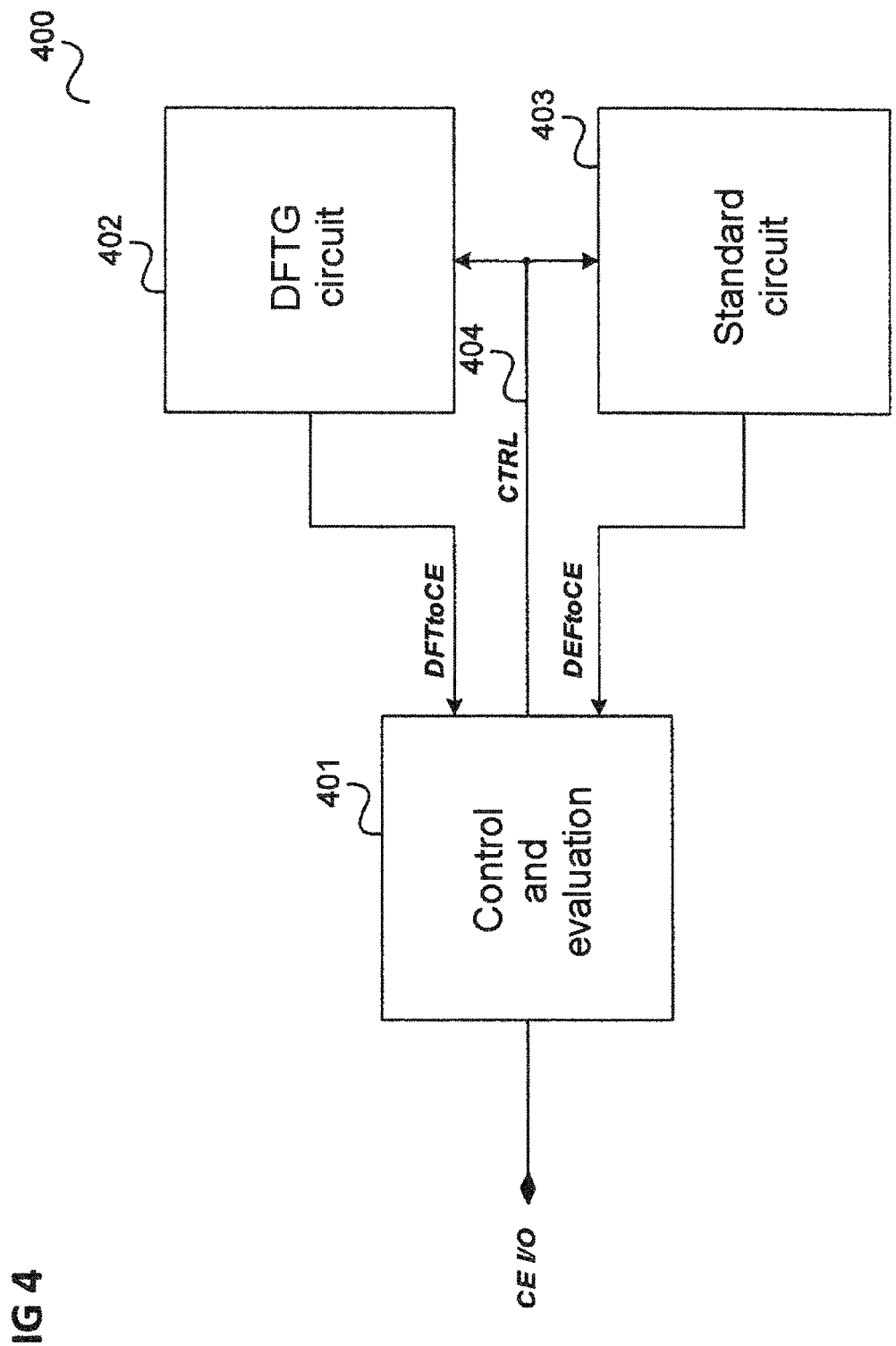
FIG. 4 shows a circuit arrangement for sensing and monitoring operating conditions for a circuit according to an embodiment.

FIG. 4 shows a circuit arrangement 400.

In the case of the circuit arrangement 400, the dependences of the switching periods of the transmission gate 200 on temperature, supply voltage and production process fluctuations are used, as a good example, for sensing and monitoring the operating conditions (such as production parameters, supply voltage (VDD) and temperature (T)) of integrated circuits.

The circuit arrangement 400 has a control and evaluation block 401, a DFTG circuit (DFTG-based circuit) 402 and a standard circuit (default circuit) 403.

The control and evaluation block 401 compares the switching response of the DFTG circuit 402, which delivers a signal DFTtoCE to the control and evaluation block 401, with the switching response of the standard circuit 403, which delivers a signal DEFtoCE to the control and evaluation block 401.

The control and evaluation block 401 controls the DFTG circuit 402 and the standard circuit 403 by means of a control line 404.

An example of the DFTG circuit 402 is described below with reference to FIG. 5 and FIG. 6.

Figure 5:
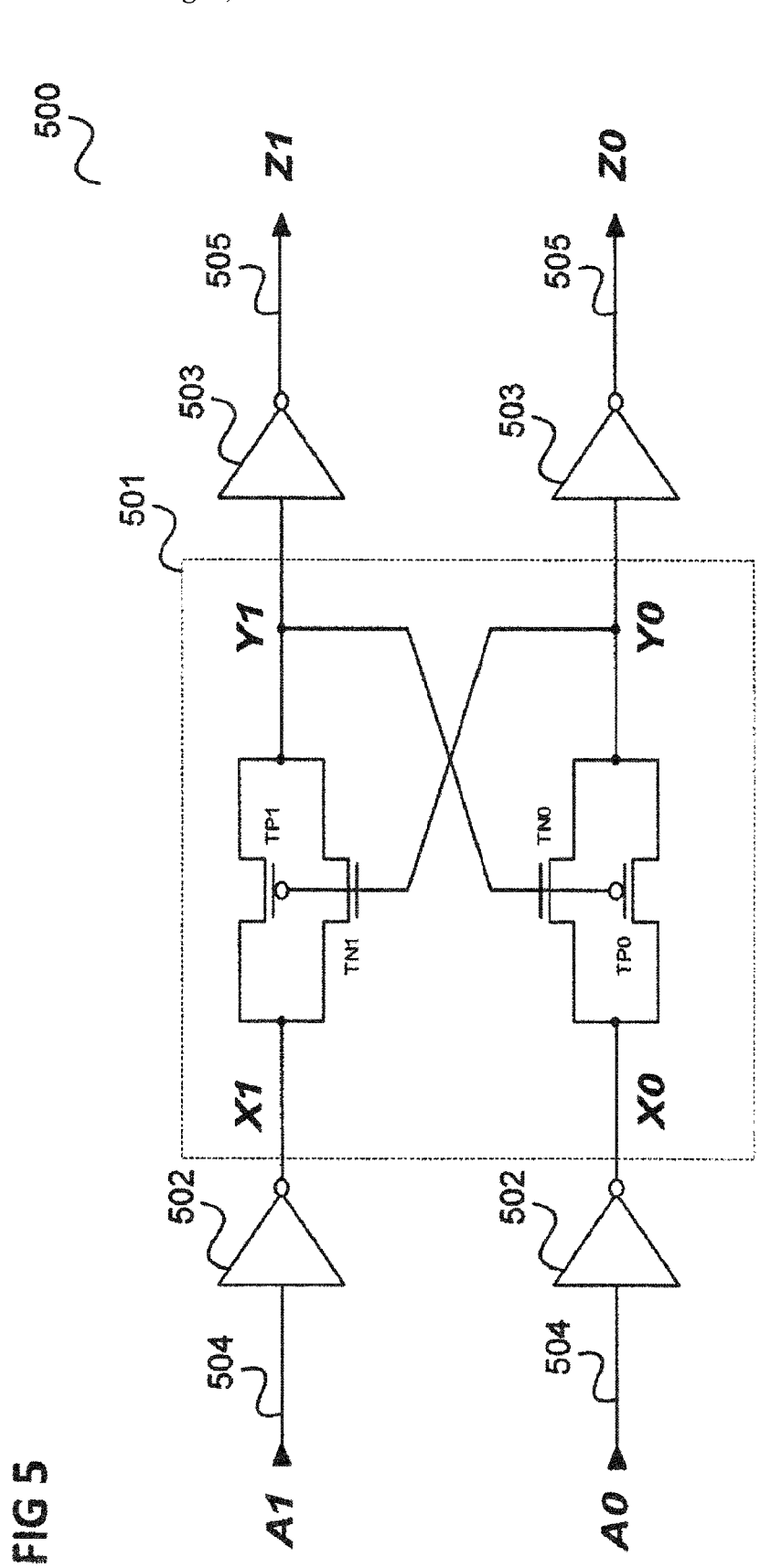
FIG. 5 shows a differential feedback buffer according to an embodiment.

FIG. 5 shows a differential feedback buffer (DFB) 500.

The feedback buffer 500 has a transmission gate 501 similar to the transmission gate 200 described in FIG. 2, wherein the inputs of the transmission gate 501 have first inverters 502 connected upstream of them and the outputs of the transmission gate 501 have second inverters 503 connected downstream of them. The inputs of the first inverter 502 form the inputs 504 (called A1, which belongs to X1, and A0, which belongs to X0) of the feedback buffer 500 and the outputs of the second inverters 503 form the outputs 505 of the feedback buffer 500 (called Z1, which belongs to Y1, and Z0, which belongs to Y0).

Figure 6:
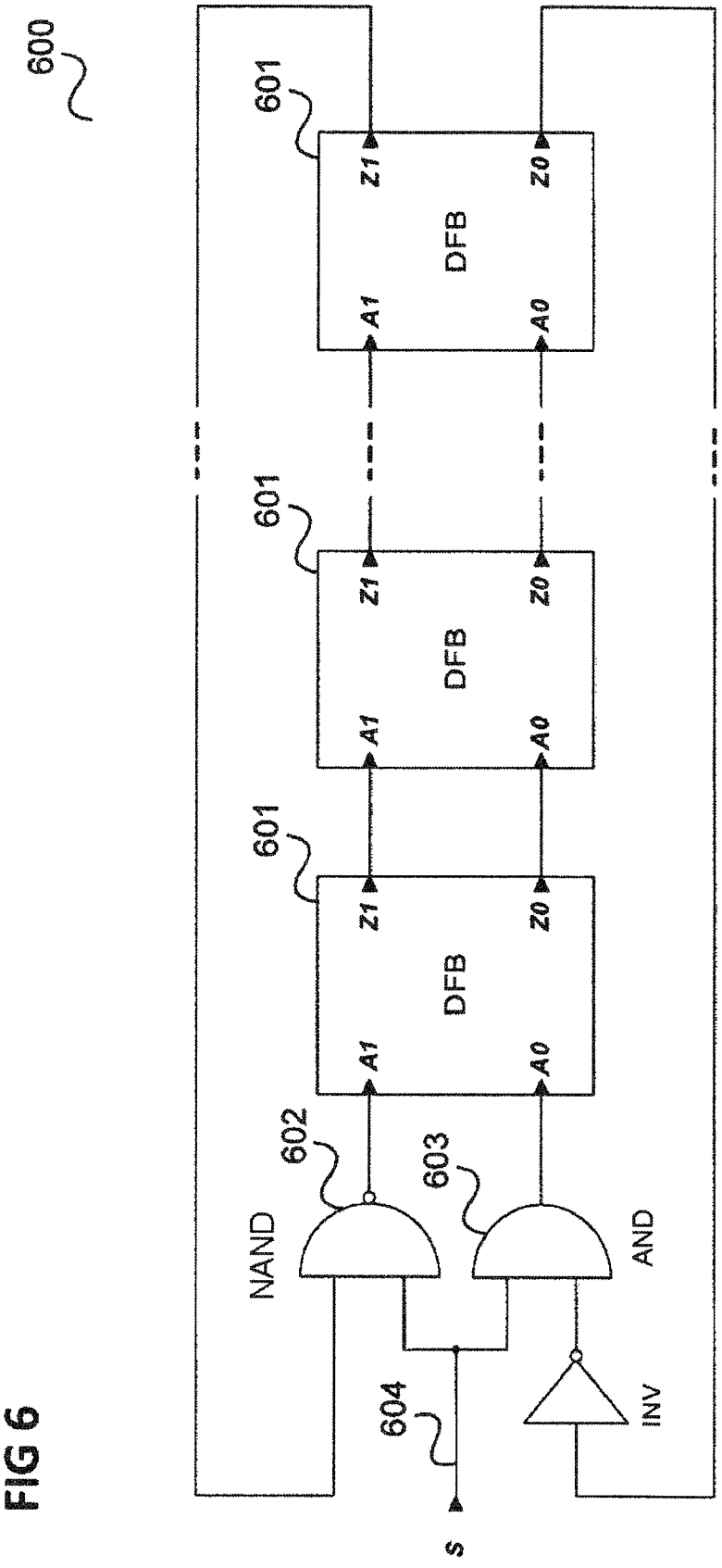
FIG. 6 shows a DFB ring oscillator according to an embodiment.

According to an embodiment, the DFTG circuit 402 is constructed by connecting a plurality of such feedback buffers 500 in series, as shown in FIG. 6.

FIG. 6 shows a DFB ring oscillator (RINGO) 600 according to an embodiment.

The DFB ring oscillator 600 has a series circuit comprising a plurality of feedback buffers 601 as described with reference to FIG. 5.

The input A1 of the first feedback buffer in the series circuit of feedback buffers 601 is connected to the output of a NAND gate 602. The input A0 of the first feedback buffer in the series circuit of feedback buffers 601 is connected to the output of an AND gate 603.

The output Z1 of the last feedback buffer in the series circuit of feedback buffers 601 is connected to an input of the NAND gate 602. The other input of the NAND gate 602 is connected to a signal input 604 of the DFB ring oscillator 600.

The output Z0 of the last feedback buffer in the series circuit of feedback buffers 601 is connected to an input of the AND gate 603 by means of an inverter 605. The other input of the AND gate 603 is connected to the signal input 604 of the DFB ring oscillator 600.

According to an embodiment, the DFB ring oscillator 600 is used as the DFTG circuit 402. The control and evaluation block 401 activates the DFB ring oscillator 600 in this case by means of the control line 404 and the signal input 604. In this case, the signal DFTtoCE is the output signal from the output Z1 of the last feedback buffer in the series circuit of feedback buffers 601, for example.

In this case, the standard circuit 403 used is a ring oscillator implemented in standard CMOS, for example, the output signal from which forms the signal DEFtoCE and is controlled by means of the control line 404 and a corresponding control input.

Figure 7:
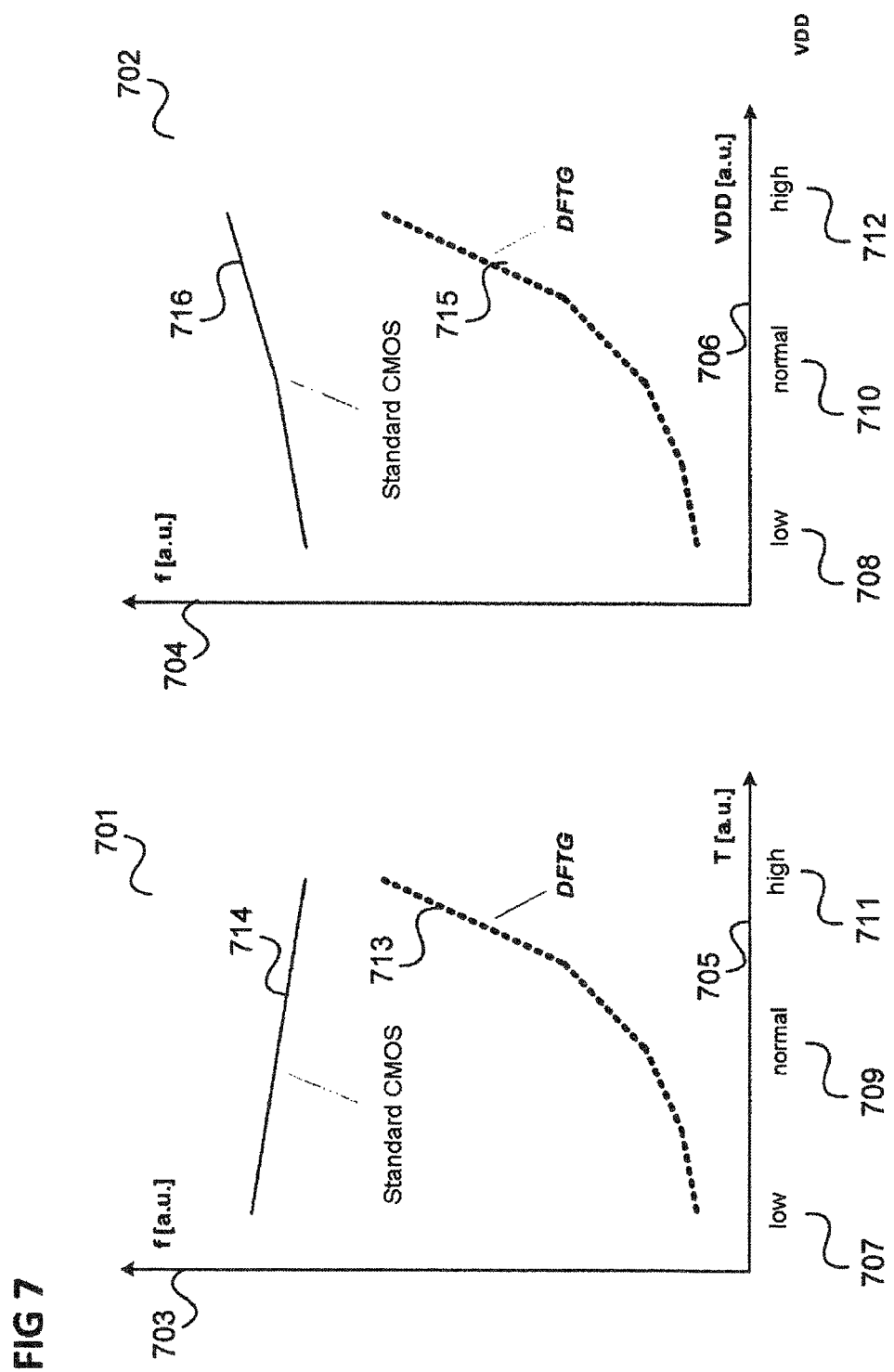
FIG. 7 shows a frequency/temperature graph and a frequency/VDD graph.

The response of the DFB ring oscillator in comparison with a ring oscillator implemented in standard CMOS is shown in FIG. 7.

FIG. 7 shows a frequency/temperature graph 701 and a frequency/VDD graph 702.

The frequency increases (in arbitrary units) from the bottom to the top in each case along a frequency axis 703, 704, and the temperature and the supply voltage VDD increase from left to right along a temperature axis 705 and a VDD axis 706 (in arbitrary units), respectively, with a range having a low temperature/low supply voltage 707, 708, a range having a normal (average) temperature/normal (average) supply voltage 709, 710 and a range having high temperature/high supply voltage 711, 712 being characterized in each case.

A first curve 713 shows the temperature dependence of the frequency of the DFB ring oscillator. A second curve 714 shows the temperature dependence of the frequency of the ring oscillator implemented in standard CMOS (also subsequently called standard ring oscillator).

A third curve 715 shows the supply voltage dependence of the frequency of the DFB ring oscillator. A fourth curve 716 shows the supply voltage dependence of the frequency of the standard ring oscillator.

The differences in their response (i.e. the dependence of the frequency on, in this example, temperature and supply voltage, a similar situation applies to the dependence—not shown here—of process fluctuations (e.g. between "fast", "normal" and "slow")), as are evident from FIG. 7, can be used by the control and evaluation block 402 as a basis for sensing and monitoring the operating conditions such as the temperature and the supply voltage.

Thus, the control and evaluation block 402 can form the quotient of the DFB ring oscillator frequency and the standard ring oscillator frequency, for example, and, for a known supply voltage, ascertain whether an admissible (specified) temperature range, for example a circuit (IC) that needs to be monitored, is observed. If the control and evaluation block 402 establishes in this way that this temperature range has been left, it can initiate suitable measures, for example.

In the case of known nominal values (e.g. for process, supply voltage and temperature) for the frequency of the DFB ring oscillator and the standard ring oscillator, the control and evaluation block 402 can (in view of the large differences between the frequency dependences) possibly even use the absolute values of these two ring oscillator frequencies for monitoring the operating temperature.

A similar situation applies to the monitoring of the supply voltage and the ascertainment of process fluctuations (e.g. in the "process technology corner").

It is likewise conceivable to use DFTG circuits for detecting ionizing radiation, on the one hand directly by virtue of a sudden frequency increase (e.g. for a ring oscillator as described above) on the basis of an abruptly increased charge carrier density by virtue of radiation-induced pair generation (and of a local increase in the temperature), and on the other hand indirectly by virtue of detection of (local) VDD fluctuations.

Since values in the range of a few 100 ns and more can very easily be achieved for $\Delta t_{WT}$ by virtue of suitable selection or variation of W, L, VDD, T, $t_r$, $t_f$, $t_d$, etc. (and therefore the time available for observation can be "stretched" within broad limits without contact), it is possible for DFTG circuits to be used as an instrument for studying interface phenomena, irreversible processes and also thermal and quantum fluctuations in the (non-)equilibrium (generation recombination, random telegraph noise, gate-and-trap-assisted band-to-band tunneling, etc.) and the relationships thereof ("fluctuation/dissipation", irreversibility and noise).

Possible extensions of the transmission gate 200 shown in FIG. 2 are described below with reference to FIG. 8 to FIG. 10.

Figure 8:
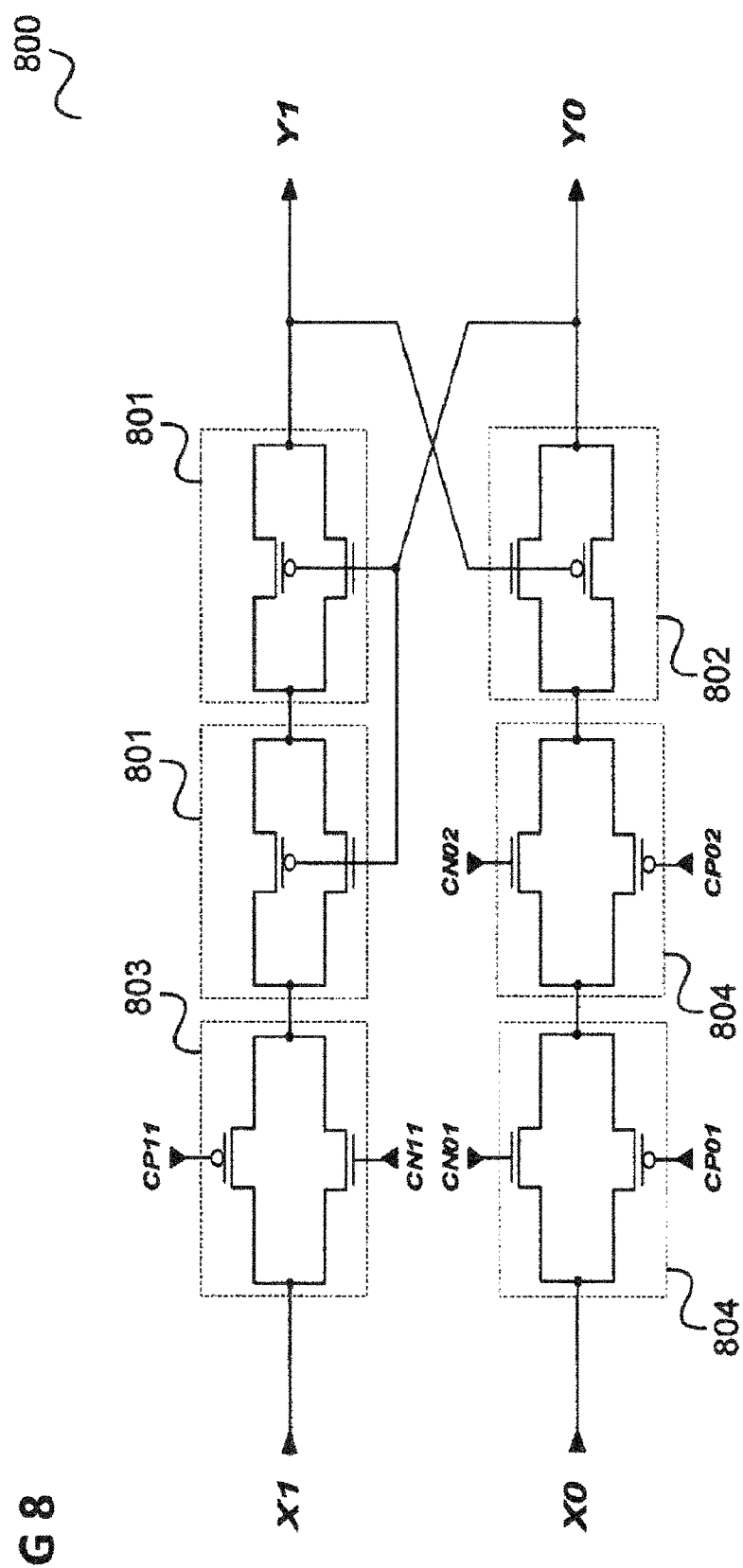
FIG. 8 shows a transmission gate according to another embodiment.

FIG. 8 shows a transmission gate 800.

In the case of the transmission gate 800, instead of one transistor pair (in this example the top transistor pair in FIG. 2, including first p-channel field-effect transistor 205 and first n-channel field-effect transistor 206), a series circuit of transistor pairs 801, which are connected up in a similar manner to the transistor pair comprising first p-channel field-effect transistor 205 and first n-channel field-effect transistor 206, is provided. Furthermore, this series circuit of transistor pairs 801 and the other (negative-feedback) transistor pair 802 (the bottom transistor pair in FIG. 2, including second p-channel field-effect transistor 208 and second n-channel field-effect transistor 207) have a transfer gate 803 and two transfer gates 804, respectively, connected upstream of them. By way of example, the transfer gates 803, 804 have gate connections CP11, CN11, . . . , CN02, CP02, which are connected to constant potentials (e.g. VDD or VSS), to external control inputs or else to the outputs (Y1, Y0 and Z1, Z0) of other DFTGs or DFBs, for example.

Figure 9:
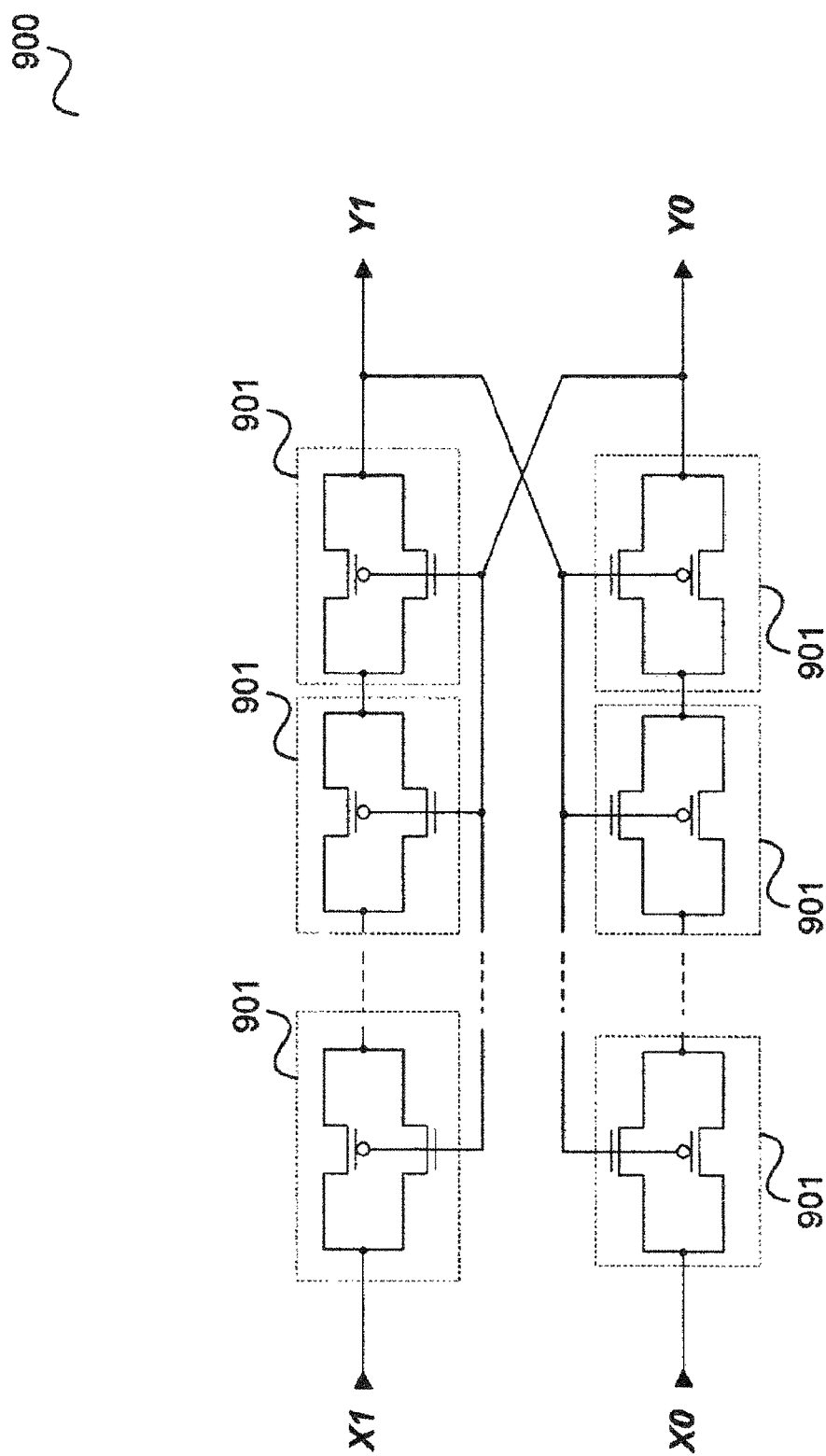
FIG. 9 shows a transmission gate according to a further embodiment.

FIG. 9 shows a transmission gate 900.

In the case of the transmission gates 900, a respective series circuit comprising a plurality of transistor pairs 901 is provided (in a similar manner to the series circuit of transistor pairs 801) for the top transistor pair in FIG. 2 and the bottom transistor pair in the figure.

Figure 10:
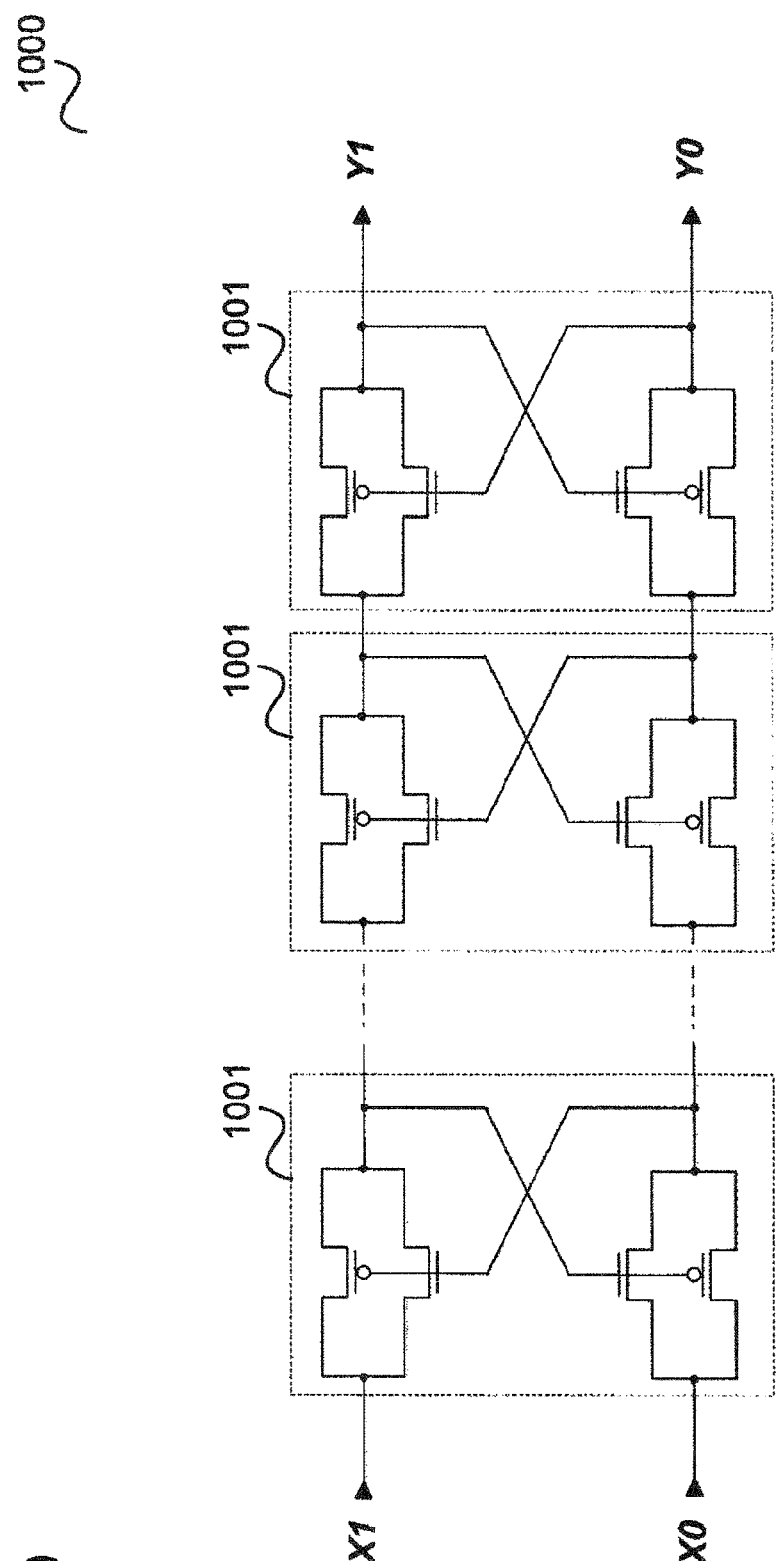
FIG. 10 shows a transmission gate according to a further embodiment.

FIG. 10 shows a transmission gate 1000.

The transmission gate 1000 has a series circuit including transmission elements 1001, which each correspond to the transmission gate 200.

The variations shown in FIG. 8 to FIG. 10, and similar variations, can be used to implement logic circuits having a quite different time response than standard CMOS circuits, for example.

DFTG circuits can be connected by means of their input nodes and/or output nodes (X1, X0, Y1, Y0) to analog circuits (e.g. (differential) amplifier circuits) too.

DFTG circuits can be implemented in CMOS technology or in other technologies. By way of example, it is also possible to use complementary bipolar transistors (npn and pnp) as complementary switches. Other technologies with complementary switching elements can be used in a similar manner.

A further instance of application for the transmission gate 200 is the generation of random numbers in integrated circuits, for example instead of a random number generator in standard CMOS circuitry.

In this case, the control and evaluation block 401 takes the comparison of the switching response of the DFTG circuit (DFTG-based circuit) 402 and the standard circuit (default circuit) 403, for example from the comparison of the frequency of a DFB ring oscillator as described in FIG. 6 with the frequency of a standard ring oscillator, as a basis for generating a random number.

The substantially increased sensitivity of the DFTG ring oscillator toward (thermal) noise in comparison with a standard ring oscillator can be used by the control and evaluation block 401 to derive random numbers from the fluctuation in the frequency difference of the two ring oscillators, which fluctuation is caused by noise. By way of example, the control and evaluation block 401 can derive a random number from one or more LSBs (least significant bits) of the counter reading of the standard ring oscillator that occurs for a prescribed counter reading of the DFTG ring oscillator.

A further instance of application for the transmission gate 200 is the inexpensive and stable and cell-based implementation of PUFs (physically unclonable functions) in integrated circuits.

"Physical unclonable functions" (PUFs) or "physical random functions" are functions for which a physical system defines and produces the relationship between input value ("challenge") C and output value ("response") R. The physical system that is taken as a basis in this case has the further properties of randomness and unclonability. The latter properties stem from basically unavoidable random fluctuations in the manufacturing process for the physical systems in question (according to the embodiment of an integrated circuit (IC) below). These are thus (microscopic) fluctuations that even the manufacturer (of the IC) cannot control in principle.

With PUFs, it is possible to produce an explicit identification identifier, what is known as an ID code, for each IC by suitably comparing random variations that exist between various ICs for MOS transistor threshold voltages (or other parameters that determine the electronic response of an IC), for example. This has the advantage that the ID code cannot be falsified, since it is based on process fluctuations that not even the IC manufacturer itself can control.

For methods for commercially employable utilization of random process variables, the following further properties are typically important or even necessary:

(1) The PUF circuit, i.e. the circuit that delivers a PUF value, needs to deliver a digital output value in the form of a binary ID code.

(2) The ID code needs to be reproducible and stable in respect of variations in supply voltage, temperature, aging and toward (thermal) noise.

(3) The ID code length and ID code stability need to allow any IC to be identified correctly with sufficiently high probability.

(4) The PUF circuit should consume little power and must not require calibration.

At present, PUF circuits are still not implemented on commercial ICs for safety applications. Said PUF circuits are still the subject matter of research projects in which various proposals for the provision of PUFs and for the design and extraction of PUF-based ID codes are being examined. These include special "identification cell arrays" as well as PUFs based on statistical propagation time variations for transistors and the wiring thereof and also PUFs that can be generated using the initial values of SRAM cells, which values have random and statistically independent distributions.

However, such provision of PUFs requires specific design of circuits, and only the initial values of SRAM cells (that is to say the values with random and statistically independent distributions that the SRAM cells assume after they have been taken from the zero-voltage (VDD=VSS) state into the specified operating state (VDD=VDD(spec))) can be used for PUF generation.

According to an embodiment, the increased sensitivity of pairs of transmission gates 200 toward production fluctuations (particularly the local variations in the channel implementations and hence the threshold voltages $V_{th}$ of the transistors) is used to generate PUFs in integrated circuits.

Figure 11:
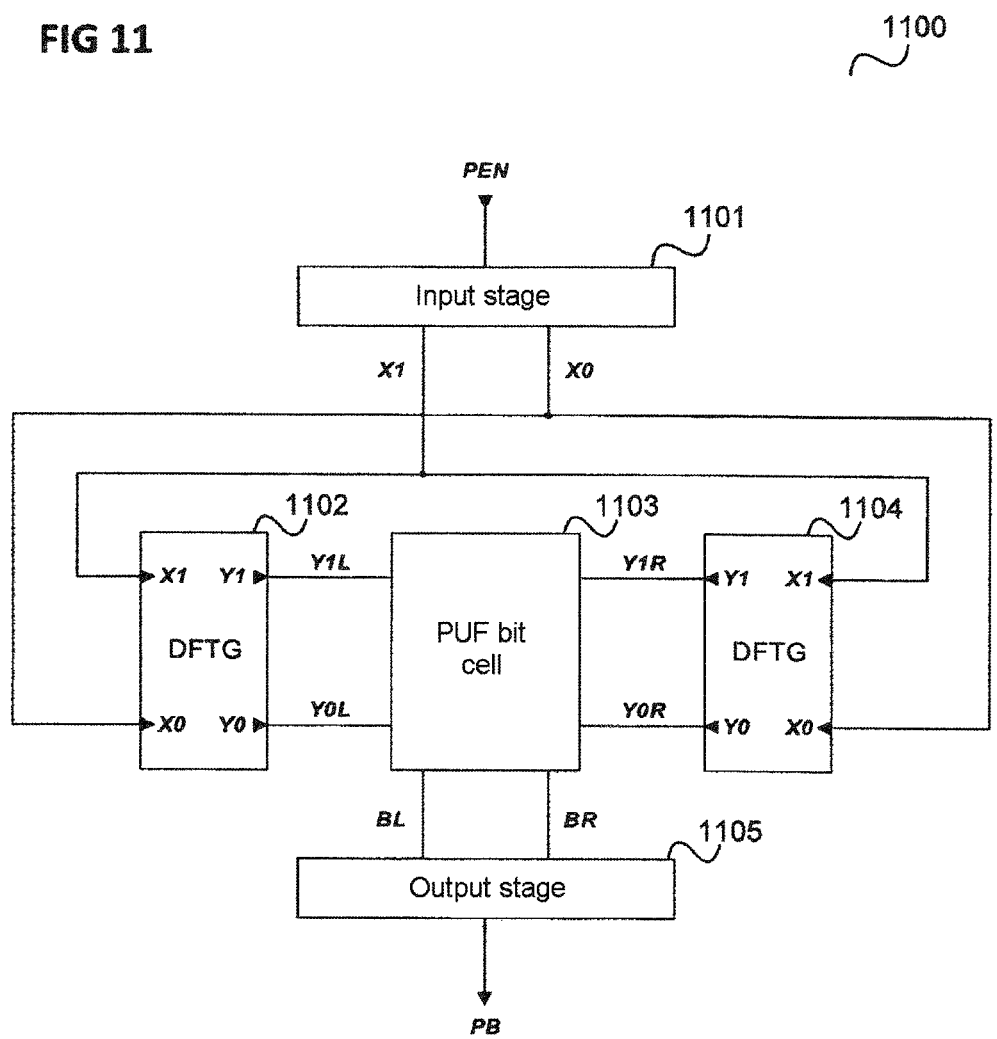
FIG. 11 shows a circuit arrangement for providing a PUF according to an embodiment.

FIG. 11 shows a circuit arrangement 1100.

The circuit arrangement 1100 is a DFTG-PUF circuit, i.e. provides a PUF by means of a DFTG circuit, i.e. a circuit that contains a transmission gate 200 as described in FIG. 2.

The circuit arrangement 1100 has an input stage 1101, a first DFTG cell 1102, which corresponds to the transmission gate 200, a second DFTG cell 1103, which corresponds to the transmission gate 200, a PUF bit cell 1104 and an output stage 1105.

The input stage 1101 has a first output, which is coupled to the X1 inputs of the DFTG cells 1102, 1103, and a second output, which is coupled to the X0 inputs of the DFTG cells 1102, 1103.

The DFTG cells 1102, 1103 are identical and symmetrically coupled to the PUF bit cell 1104.

The Y1 output signal from the first DFTG cell 1102 is denoted by Y1L. The Y0 output signal from the first DFTG cell 1102 is denoted by Y0L. The Y1 output signal from the second DFTG cell 1103 is denoted by Y1R. The Y0 output signal from the second DFTG cell 1103 is denoted by Y0R.

The output signals Y1L, Y0L, Y1R and Y0R are supplied to the PUF bit cell 1104.

The PUF bit cell 1104 is a latch having two stable states. Depending on the DFTG cell 1102, 1104 for which (Y1, Y0) are accordingly adjusted following changeover of (X1, X0), the latch adjusts itself to one of the states. This is dependent on process fluctuations and is characteristic of the circuit arrangement 1100 and is therefore suitable as part of a PUF value or a basis for a PUF value for an integrated circuit that contains the circuit arrangement 1100.

The DFTG cells 1102, 1103 are actuated using the input stage 1101, which takes a PEN (PUF Enable) signal and generates the actuation signals for the X1 inputs and the X0 inputs of the DFTG cells 1102, 1103, e.g. by means of simple inverter stages.

The output stage 1105 is used for processing the PUF bit, that is to say the complementary values BL, BR, provided by the PUF bit cell, with the pair (BL, BR) accordingly being able to assume (0,1) or (1,0). The output stage 1105 outputs PB=BL or PB=BR. This output can be produced by the output stage 1105 in a similar manner to the input stage 1101, for example by means of simple inverter stages. Furthermore, the output stage 1105 may also have simple nMOS transfer gates, however, for example as provided in an SRAM, for example when the 1100 is not intended to be provided as a standard cell but rather in an arrangement in a cell array.

Examples of implementation of the PUF bit cell are described below with reference to FIG. 12 to FIG. 14. In each case, combination options between the connections of the respective PUF bit cell and the nodes Y1L, Y0L and Y1R, Y0R are specified in this instance. It will be assumed that in the precharge state Y1L=Y1R=0 and Y0L=Y0R=1 is true.

Figure 12:
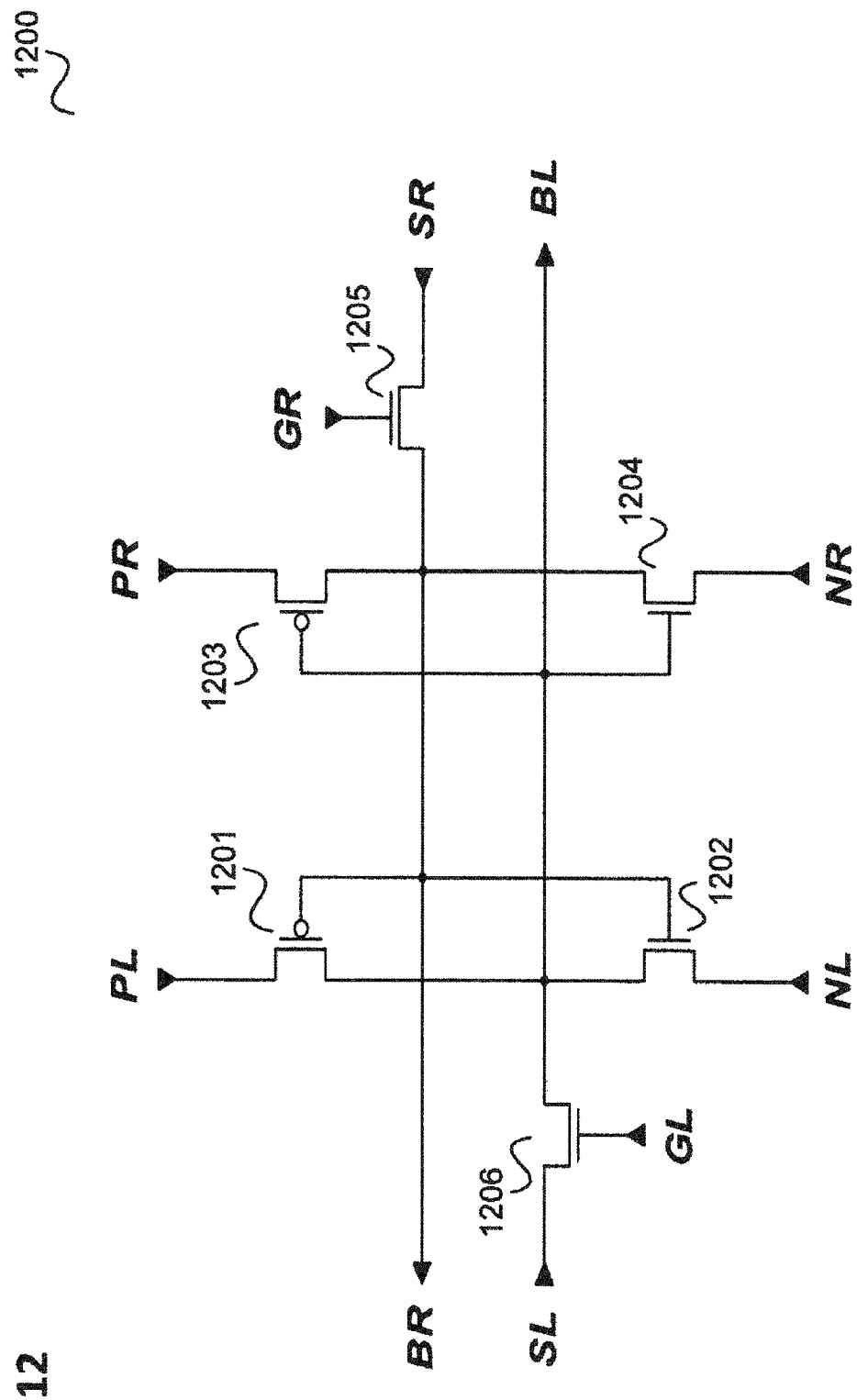
FIG. 12 shows a PUF bit cell according to an embodiment.

FIG. 12 shows a PUF bit cell 1200 according to an embodiment.

The PUF bit cell 1200 has inputs PL, PR, GL, GR, SL, SR, NL and NR. Furthermore, the PUF bit cell 1200 has outputs BR, BL, which correspond to the outputs of the PUF bit cell 1104 in FIG. 11.

The input PL is connected to the input NL by means of a series circuit comprising a first p-channel field-effect transistor 1201 and a first n-channel field-effect transistor 1202, the gates of which are connected to the output BR.

The input PR is connected to the input NR by means of a series circuit comprising a second p-channel field-effect transistor 1203 and a second n-channel field-effect transistor 1204, the gates of which are connected to the output BL.

The input SR is connected to the output BR by means of a third n-channel field-effect transistor 1205, the gate of which is connected to the input GR.

The input SL is connected to the output BL by means of a fourth n-channel field-effect transistor 1206, the gate of which is connected to the input GL.

Furthermore, the output BL is connected to the connection node between the first p-channel field-effect transistor 1201 and the first n-channel field-effect transistor 1202.

Furthermore, the output BR is connected to the connection node between the second p-channel field-effect transistor 1203 and the second n-channel field-effect transistor 1204.

By way of example, the PUF bit cell 1200 is connected to the DFTG cells 1102, 1103 as follows (the equals sign meaning that the two respective nodes are connected to one another):

| | |
|---|---|
| PL = Y1L | PR = Y1R |
| SL = Y1L or VSS | SR = Y1R or VSS |
| GL = Y0L | GR = Y0R |
| NL = Y0L or VSS | NR = Y0R or VSS |

Figure 13:
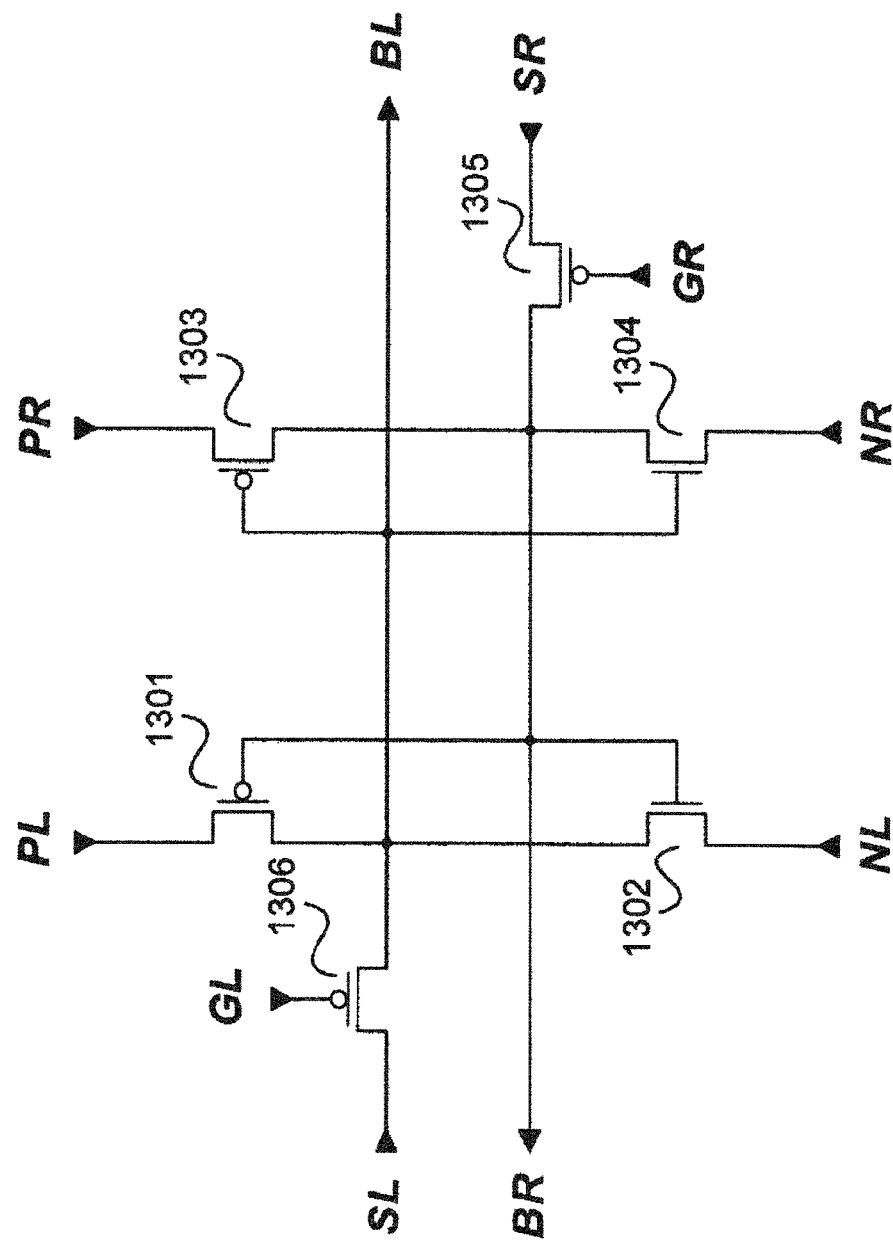
FIG. 13 shows a PUF bit cell according to another embodiment.

FIG. 13 shows a PUF bit cell 1300 according to an embodiment.

The PUF bit cell 1300 has inputs PL, PR, GR, SR, SL, NL, NR and GL. Furthermore, the PUF bit cell 1300 has outputs BR, BL, which correspond to the outputs of the PUF bit cell 1104 in FIG. 11.

The input PL is connected to the input NL by means of a series circuit comprising a first p-channel field-effect transistor 1301 and a first n-channel field-effect transistor 1302, the gates of which are connected to the output BR.

The input PR is connected to the input NR by means of a series circuit comprising a second p-channel field-effect transistor 1303 and a second n-channel field-effect transistor 1304, the gates of which are connected to the output BL.

The input SR is connected to the output BR by means of a third p-channel field-effect transistor 1305, the gate of which is connected to the input GR.

The input SL is connected to the output BL by means of a fourth p-channel field-effect transistor 1306, the gate of which is connected to the input GL.

Furthermore, the output BL is connected to the connection node between the first p-channel field-effect transistor 1301 and the first n-channel field-effect transistor 1302.

Furthermore, the output BR is connected to the connection node between the second p-channel field-effect transistor 1303 and the second n-channel field-effect transistor 1304.

By way of example, the PUF bit cell 1300 is connected to the DFTG cells 1102, 1103 as follows (the equals sign meaning that the two respective nodes are connected to one another):

| | |
|---|---|
| PL = Y1L or VDD | PR = Y1R or VDD |
| SL = Y0L or VDD | SR = Y0R or VDD |
| GL = Y1 | GR = Y1R |
| NL = Y0L | NR = Y0R |

Figure 14:
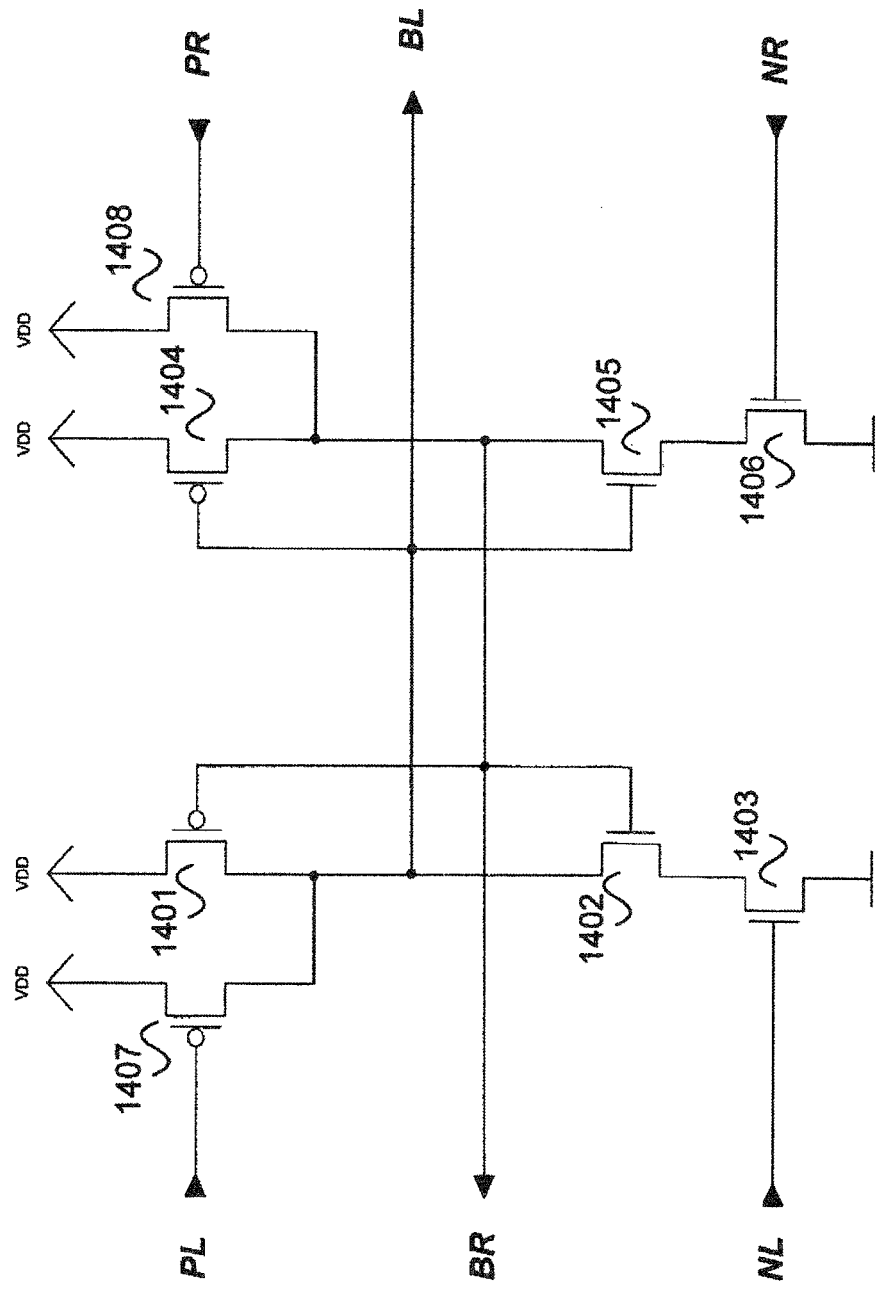
FIG. 14 shows a PUF bit cell according to a further embodiment.

FIG. 14 shows a PUF bit cell 1400 according to an embodiment.

The PUF bit cell 1400 has inputs PL, PR, NL and NR. Furthermore, the PUF bit cell 1400 has outputs BR, BL, which correspond to the outputs of the PUF bit cell 1104 in FIG. 11.

The PUF bit cell 1400 has a series circuit comprising a first p-channel field effect transistor 1401, a first n-channel field-effect transistor 1402 and a second n-channel field-effect transistor 1403 between VDD and VSS. The gates of the first p-channel field-effect transistor 1401 and the first n-channel field-effect transistor 1402 are connected to the output BR, and the gate of the second n-channel field-effect transistor 1403 is connected to the input NL.

Furthermore, the PUF bit cell 1400 has a series circuit comprising a second p-channel field-effect transistor 1404, a third n-channel field-effect transistor 1405 and a fourth n-channel field-effect transistor 1406 between VDD and VSS. The gates of the second p-channel field-effect transistor 1404 and the third n-channel field-effect transistor 1405 are connected to the output BL, and the gate of the fourth n-channel field-effect transistor 1406 is connected to the input NR.

The output BR is connected to VDD by means of a fourth p-channel field-effect transistor 1408, the gate of which is connected to the input PR.

Furthermore, the output BR is connected to the connection node of the second p-channel field-effect transistor 1404 and the third n-channel field-effect transistor 1405.

The output BL is connected to VDD by means of a third p-channel field-effect transistor 1407, the gate of which is connected to the input PL.

Furthermore, the output BL is connected to the connection node between the first p-channel field-effect transistor 1401 and the first n-channel field-effect transistor 1402.

By way of example, the PUF bit cell 1400 is connected to the DFTG cells 1102, 1103 as follows (the equals sign meaning that the two respective nodes are connected to one another):

| | |
|---|---|
| PL = NL = Y1L | PR = NR = Y1R |

Figure 15:
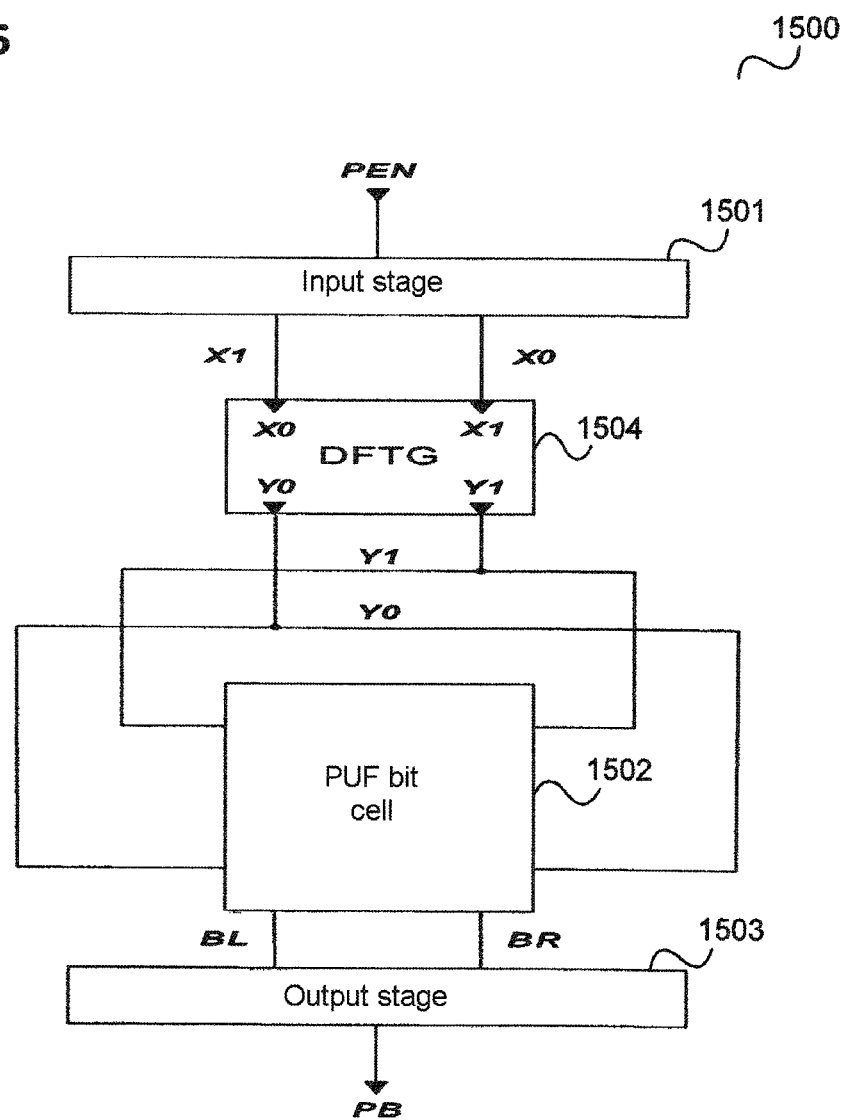
FIG. 15 shows a circuit arrangement for providing a PUF according to another embodiment.

FIG. 15 show a circuit arrangement 1500.

The circuit arrangement 1500 is a further example of a DFTG-PUF circuit.

The circuit arrangement 1500 has an input stage 1501 similar to the input stage 1101, a PUF bit cell 1502 similar to the PUF bit cell 1103 and an output stage 1503 similar to the output stage 1105.

In contrast to the circuit arrangement 1100, the circuit arrangement 1500 has only one DFTG cell 1504, the inputs X1 and X0 of which are connected to the input stage 1501 as in the case of the DFTG cells 1102, 1103, but with the inputs of the PUF bit cell 1502, which are connected to Y1L and Y1R in FIG. 11, both being connected to Y1, and the inputs of the PUF bit cell 1502, which are connected to Y0L and Y0R in FIG. 11, both being connected to Y0.

Hence, in the case of the circuit arrangement 1500, a single DFTG cell actuates both sides (both Y1R and Y1L and Y0R and Y0L) of the PUF bit cell, in contrast to the circuit arrangement 1100, in the case of which each side of the PUF bit cell is connected to a dedicated DFTG cell 1102, 1103 on the input side.

In this example, the PUF is therefore based on process fluctuations in the PUF bit cell 1502 and not also on fluctuations in the properties of two mirror-image DFTG cells as in the circuit arrangement 1100.

The circuit arrangement 1500 can be implemented with a smaller number of transistors than the circuit arrangement 1100.

Figure 16:
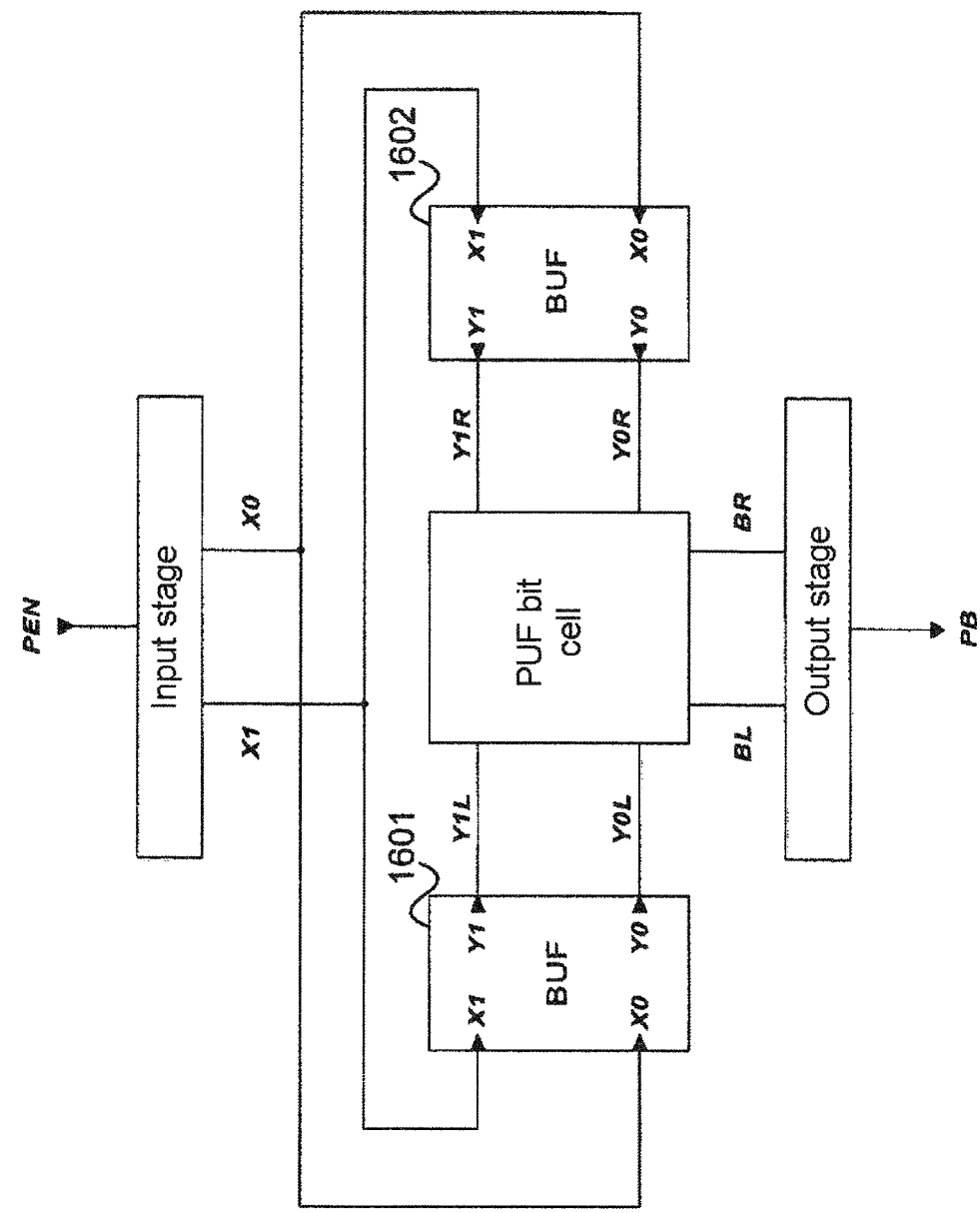
FIG. 16 shows a circuit arrangement for providing a PUF.
Figure 17:
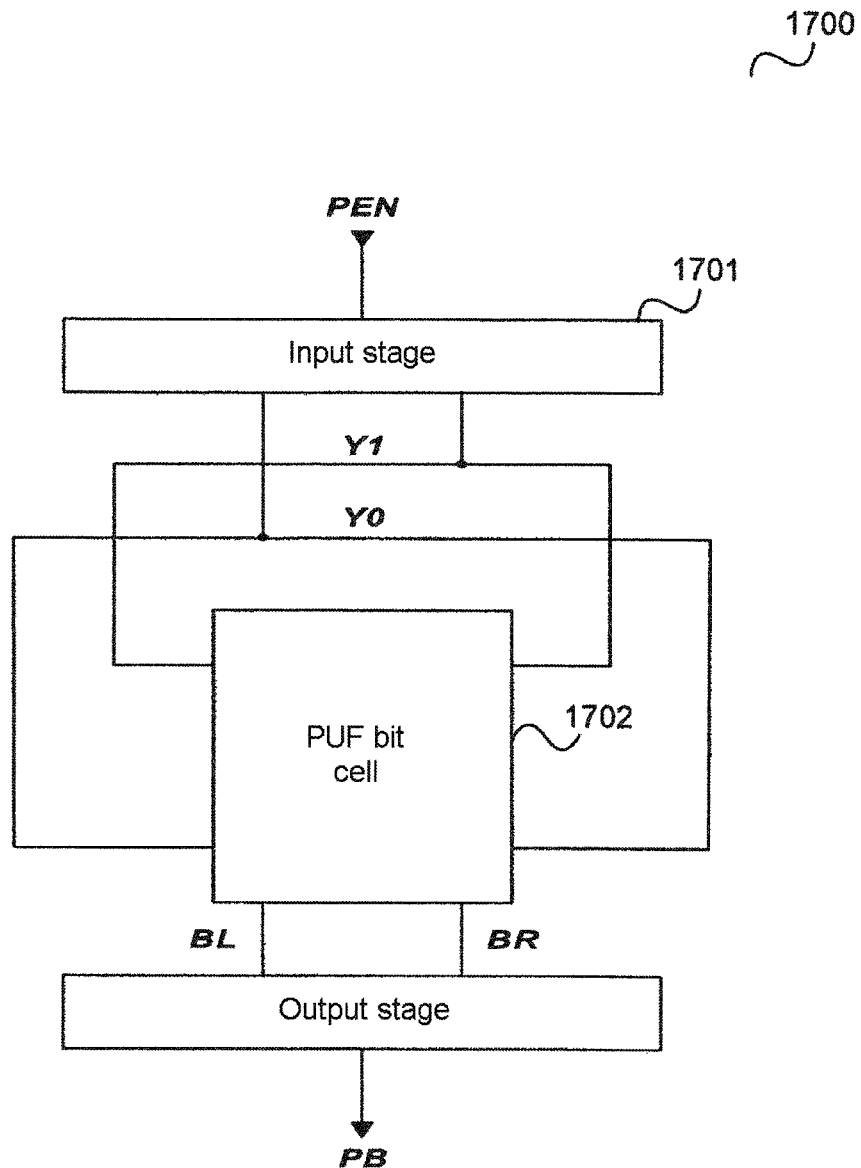
FIG. 17 shows a circuit arrangement for providing a PUF.

Further examples of circuit arrangements that provide a PUF are shown in FIG. 16 and FIG. 17.

FIG. 16 shows a circuit arrangement 1600.

The circuit arrangement 1600 corresponds to the circuit arrangement 1100 with the difference that instead of the DFTG cells 1102, 1103, buffers 1601, 1602 are provided, which buffer the signal applied to the input X1 and output it via the output Y1 and buffer the signal applied to the input X0 and output it via the output Y0.

FIG. 17 shows a circuit arrangement 1700.

The circuit arrangement 1700 corresponds to the circuit arrangement 1600, and in this case the buffers 1601, 1602 are dispensed with and the outputs of the input stage 1701 are connected directly to the inputs of the PUF bit cell 1702.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic transmission element, comprising:
   a first input and a first output, wherein the first input is coupled to the first output by means of two first, parallel-connected complementary switches, wherein the first switches each have a control input;
   a second input and a second output, wherein the second input is coupled to the second output by means of two second, parallel-connected complementary switches, wherein the second switches each have a control input;
   wherein the first output is coupled to the control inputs of the second switches and the second output is coupled to the control inputs of the first switches.

2. The electronic transmission element of claim 1, wherein the first switches and the second switches are transistors.

3. The electronic transmission element of claim 1, wherein the first switches are an n-channel field-effect transistor and a p-channel field-effect transistor and the second switches are an n-channel field-effect transistor and a p-channel field-effect transistor and wherein the control inputs of the switches are the gate connections of the field-effect transistors.

4. The electronic transmission element of claim 1, wherein the first switches are an npn bipolar transistor and a pnp bipolar transistor and the second switches are an npn bipolar transistor and a pnp bipolar transistor and wherein the control inputs of the switches are the base connections of the bipolar transistors.

5. The electronic transmission element of claim 1, wherein the first switches are designed such that they switch at different times.

6. The electronic transmission element of claim 1, wherein the first switches are designed such that they switch at different levels of the second output node.

7. The electronic transmission element of claim 1, wherein the second switches are designed such that they switch at different times.

8. The electronic transmission element of claim 1, wherein the second switches are designed such that they switch at different levels of the first output node.

9. The electronic transmission element of claim 1, wherein the first switches and the second switches are set up to each switch between a first state and a second state,
   wherein a switch conducts current better in the second state than in the first state.

10. The electronic transmission element of claim 9, wherein the first switches and the second switches are field-effect transistors and are in strong inversion in the first state and in weak inversion, or in the off state, in the second state.

11. The electronic transmission element of claim 1, wherein at least one of the first switches is of a different design than the second switches.

12. The electronic transmission element of claim 1, wherein at least one of the first switches has different dimensions than the second switches.

13. The electronic transmission element of claim 1, wherein the first output comprises a first output of the electronic transmission element.

14. The electronic transmission element of claim 1, wherein the first input and the second input are parallel to each other.

15. The electronic transmission element of claim 1, wherein the first input and the second input are separate from each other.

16. The electronic transmission element of claim 1, wherein the first switches and the second switches are parallel to each other.

17. A circuit arrangement, comprising:
    an electronic transmission element, comprising:
       a first input and a first output, wherein the first input is coupled to the first output by means of two first, parallel-connected complementary switches, wherein the first switches each have a control input;
       a second input and a second output, wherein the second input is coupled to the second output by means of two second, parallel-connected complementary switches, wherein the second switches each have a control input;
       wherein the first output is coupled to the control inputs of the second switches and the second output is coupled to the control inputs of the first switches;
    the circuit arrangement further comprising:
    an input stage that is set up to supply the first input of the transmission element with a first logic level and to supply the second input of the transmission element with a second logic level, which is a complement of the first logic level.

18. The circuit arrangement of claim 17, wherein the circuit arrangement is set up to take the delay with which the transmission element outputs the supplied logic levels by means of the outputs as a basis for ascertaining at least one from a physical unclonable function value, a random number, an operating parameter and a production parameter for the circuit arrangement.

19. The circuit arrangement of claim 17, further comprising:
    a ring oscillator that has the transmission element,
    wherein the circuit arrangement is set up to take the frequency of the ring oscillator as a basis for ascertaining at least one from a physical unclonable function value, a random number, an operating parameter and a production parameter for the circuit arrangement.

20. The circuit arrangement of claim 17, wherein the operating parameter is an operating temperature for the circuit arrangement or a supply voltage for the circuit arrangement.

* * * * *